(12) United States Patent
Cheng et al.

(10) Patent No.: US 11,757,450 B2
(45) Date of Patent: Sep. 12, 2023

(54) RANDOM-NUMBER GENERATOR AND RANDOM-NUMBER GENERATING METHOD

(71) Applicant: Nuvoton Technology Corporation, Hsinchu Science Park (TW)

(72) Inventors: Ling-I Cheng, Taoyuan (TW); Chih-Ming Hsieh, Hsinchu (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 0 days.

(21) Appl. No.: 17/573,917

(22) Filed: Jan. 12, 2022

(65) Prior Publication Data

US 2022/0311443 A1 Sep. 29, 2022

(30) Foreign Application Priority Data

Mar. 26, 2021 (TW) .................................. 110111082

(51) Int. Cl.
  *G06F 7/58* (2006.01)
  *H03K 19/17704* (2020.01)
  *H03K 19/017* (2006.01)
  *H03K 5/00* (2006.01)
  *H03K 19/21* (2006.01)

(52) U.S. Cl.
  CPC ....... *H03K 19/17716* (2013.01); *G06F 7/588* (2013.01); *H03K 5/00006* (2013.01); *H03K 19/01728* (2013.01); *H03K 19/21* (2013.01)

(58) Field of Classification Search
  CPC ............... G06F 7/588; H03K 5/00006; H03K 19/01728; H03K 19/17716; H03K 19/21
  See application file for complete search history.

(56) References Cited

U.S. PATENT DOCUMENTS

| | | | | |
|---|---|---|---|---|
| 9,058,228 | B2* | 6/2015 | Sackett | ................... G06F 7/588 |
| 10,929,102 | B2* | 2/2021 | Huang | ................... G06F 7/588 |
| 2003/0037079 | A1 | 2/2003 | Wilber | |

(Continued)

FOREIGN PATENT DOCUMENTS

| | | |
|---|---|---|
| CN | 111538475 A | 1/2010 |
| CN | 101620523 A | 3/2015 |

(Continued)

*Primary Examiner* — Kurtis R Bahr
(74) *Attorney, Agent, or Firm* — Muncy, Geissler, Olds & Lowe, P.C.

(57) ABSTRACT

A true random-number generator generating a random variable is provided. A first delay circuit delays an input signal to generate a first delayed signal. A second delay circuit delays the first delayed signal to generate a second delayed signal. A first sampling circuit samples the input signal according to a clock signal to generate a first sampled signal. A second sampling circuit samples the first delayed signal according to the clock signal to generate a second sampled signal. A third sampling circuit samples the second delayed signal according to the clock signal to generate a third sampled signal. An operational circuit generates the random variable and adjusts a count value according to the first sampled signal, the second sampled signal, and the third sampled signal. The operational circuit adjusts the clock signal according to the count value.

20 Claims, 4 Drawing Sheets

(56) References Cited

U.S. PATENT DOCUMENTS

2010/0281088 A1* 11/2010 Wilber .................... G06F 7/588
                                                         708/251
2014/0201253 A1*  7/2014 Chu ........................ G06F 7/588
                                                         708/250
2021/0286592 A1*  9/2021 Murata .................. H03K 19/21

FOREIGN PATENT DOCUMENTS

| CN | 105242903 A | * | 1/2016 | ............... G06F 7/58 |
| CN | 105242903 A |   | 1/2016 | |
| TW | 201430699 A |   | 8/2014 | |
| TW | 202028962 A |   | 8/2020 | |
| TW | 202034158 A |   | 9/2020 | |

* cited by examiner

RANDOM-NUMBER GENERATOR AND RANDOM-NUMBER GENERATING METHOD

CROSS REFERENCE TO RELATED APPLICATIONS

This Application claims priority of Taiwan Patent Application No. 110111082, filed on Mar. 26, 2021, the entirety of which is incorporated by reference herein.

BACKGROUND OF THE INVENTION

Field of the Invention

The invention relates to a controller, and more particularly to a random-number generator which is a true random-number generator.

Description of the Related Art

With the development of electronic devices, random numbers are used in computer security protection. They are used in other fields, but they are especially important in the field of computer security protection. However, when the rules for generating a random number can be predicted, this can affect the security of the data stored in the computer.

BRIEF SUMMARY OF THE INVENTION

In accordance with an embodiment of the disclosure, a true random-number generator generates a random variable and comprises a first delay circuit, a second delay circuit, a first sampling circuit, a second sampling circuit, a third sampling circuit, and an operational circuit. The first delay circuit delays an input signal to generate a first delayed signal. The second delay circuit delays the first delayed signal to generate a second delayed signal. The first sampling circuit samples the input signal according to a clock signal to generate a first sampled signal. The second sampling circuit samples the first delayed signal according to the clock signal to generate a second sampled signal. The third sampling circuit samples the second delayed signal according to the clock signal to generate a third sampled signal. The operational circuit generates the random variable and adjusts a count value according to the first sampled signal, the second sampled signal, and the third sampled signal. The operational circuit adjusts the clock signal according to the count value.

In accordance with a further embodiment of the disclosure, a random-number generating method for generating a random variable comprises delaying an input signal to generate a first delayed signal; delaying the first delayed signal to generate a second delayed signal; sampling the input signal according to a clock signal to generate a first sampled signal; sampling the first delayed signal according to the clock signal to generate a second sampled signal; sampling the second delayed signal according to the clock signal to generate a third sampled signal; generating the random variable and adjusting a count value according to the first sampled signal, the second sampled signal and the third sampled signal; and adjusting the clock signal according to the count value.

Random-number generating methods for generating a random variable may be practiced by true random-number generators which have hardware or firmware capable of performing particular functions and may take the form of program code embodied in a tangible media. When the program code is loaded into and executed by an electronic device, a processor, a computer or a machine, the electronic device, the processor, the computer or the machine becomes an true random-number generator for practicing the disclosed method.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Figure 1:
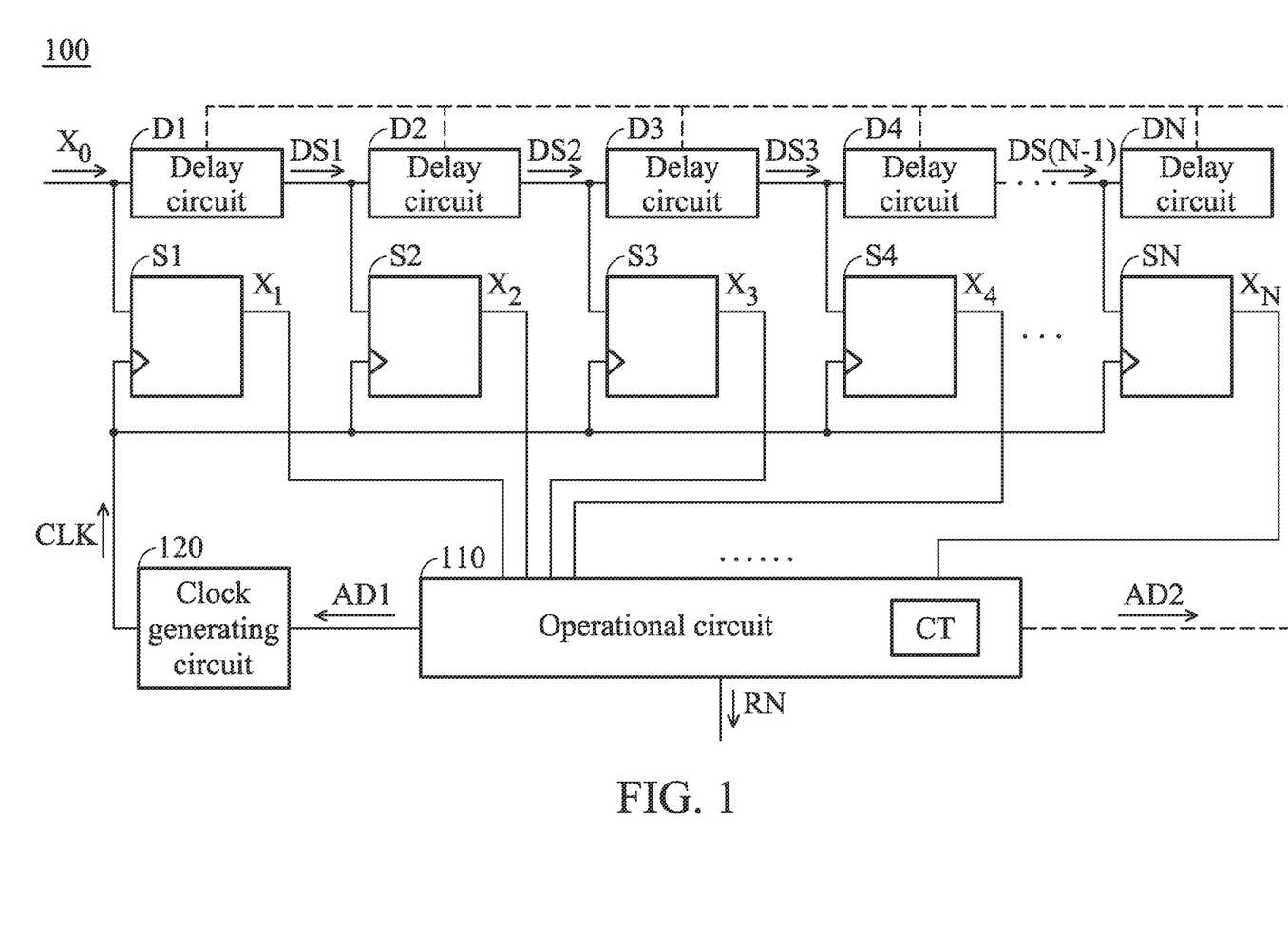
FIG. 1 is a schematic diagram of an exemplary embodiment of a true random-number generator according to various aspects of the present disclosure.

FIG. 1 is a schematic diagram of an exemplary embodiment of a true random-number generator according to various aspects of the present disclosure. The true random-number generator 100 is configured to generate a random variable RN and comprises delay circuits D1~DN, sampling circuits S1~SN, and an operational circuit 110. The delay circuits D1~DN are connected in series with one another. Since the features of the delay circuits D1~DN are the same, the delay circuits D1 and D2 are provided as an example. In this embodiment, the delay circuit D1 delays an input signal $X_0$ to generate a delayed signal DS1. The delay circuit D2 delays the delayed signal DS1 to generate a delayed signal DS2. In one embodiment, the input signal $X_0$ is random data.

The sampling-circuits S1~SN sample the delayed signals DS1~DS(N−1). Since the features of the sampling circuits S1~SN are the same, the sampling circuits S1~S3 are provided as an example. The sampling circuit S1 samples the input signal $X_0$ according to a clock signal CLK to generate a sampled signal $X_1$. The sampling circuit S2 samples the delayed signal DS1 according to the clock signal CLK to generate a sampled signal $X_2$. The sampling circuit S3 samples the delayed signal DS2 according to the clock signal CLK to generate a sampled signal $X_3$. The structures of sampling circuits S1~SN are not limited in the present disclosure. In one embodiment, the sampling circuits S1~SN are flip-flops, such as D flip-flops, latches or registers.

The operational circuit 110 generates the random variable RN and adjusts the count value CT according to the sampled signals $X_1$~$X_N$. In one embodiment, the operational circuit 110 comprises a metastable detection circuit (not shown). The metastable detection circuit determines whether a metastable event occurs according to the levels of the sampled signals $X_1 \sim X_N$. Taking the sampling circuit S4 as an example, when a metastable event does not occur, the level of the sampled signal $X_4$ is the same as the level of the delayed signal DS2. However, when a metastable event occurs, the level of the sampled signal $X_4$ is not equal to the level of the delayed signal DS3. At this time, the level of the sampled signal $X_4$ cannot be detected. The level of the sampled signal $X_4$ may be a high level or a low level.

In one embodiment, when a metastable event occurs, the operational circuit 110 adjusts the count value CT. In such cases, when the number of occurrences of the metastable event is too low, the operational circuit 110 adjusts (e.g., to increase) the frequency of the clock signal CLK to increase the number of occurrences of the metastable event. In another embodiment, when the number of occurrences of the metastable event is too much, the operational circuit 110 adjusts (e.g., to decrease) the frequency of the clock signal CLK to reduce the number of occurrences of the metastable event.

In other embodiments, the operational circuit 110 determines whether to adjust the count value CT according to the levels of the sampled signals $X_1 \sim X_N$. For example, when the level of one of the sampled signals $X_1 \sim X_N$ is different than the level of another of the sampled signals $X_1 \sim X_N$, the operational circuit 110 adjusts the count value CT. When the levels of the sampled signals $X_1 \sim X_N$ are the same, the operational circuit 110 does not adjust the count value CT.

In some embodiments, the operational circuit 110 determines how long it takes for the count value CT to reach the predetermined value. When the time it takes the count value CT to reach the predetermined value is longer than a first predetermined time (e.g., 5 seconds), it means that the number of occurrences of the metastable event is too low. Therefore, the operational circuit 110 increases the frequency of the clock signal CLK. However, when the time it takes the count value CT to reach the predetermined value is less than a second predetermined time (e.g., 1 second), it means that the number of occurrences of the metastable event is too high. Therefore, the operational circuit 110 reduces the frequency of the clock signal CLK.

In other embodiments, after receiving the sampled signals $X_1 \sim X_N$, the operational circuit 110 activates a timer (not shown). The timer performs a counting operation. When the performing time of the timer reaches a third predetermined time (e.g., 10 seconds), the timer may send an interrupt signal (not shown). In such cases, after receiving the interrupt signal, the operational circuit 110 determines whether the count value CT is equal to a predetermined value. When the count value CT is not equal to a predetermined value, the operational circuit 110 increases the frequency of the clock signal CLK.

The present disclosure does not limit how the operational circuit 110 adjusts the clock signal CLK. In one embodiment, the operational circuit 110 generates an adjustment signal AD1 to a clock generating circuit 120 according to the count value CT. The clock generating circuit 120 adjusts the frequency of the clock signal CLK according to the adjustment signal AD1. In some embodiments, the clock generating circuit 120 is a high frequency oscillator. In this embodiment, the clock generating circuit 120 is combined into the true random-number generator 110. In other embodiments, the clock generating circuit 120 is disposed independent of the true random-number generator 110 or combined into the operational circuit 110.

In some embodiments, the operational circuit 110 adjusts the delay parameter of each of the delay circuits D1~DN according to the count value CT. In this case, the operational circuit 110 generates an adjustment signal AD2 according to the count value CT. Each of the delay circuits D1~DN sets the delay parameter according to the adjustment signal AD2 and delays a corresponding signal (e.g., the input signal $X_0$ or the delayed signal DS1~DS(N−1)) according to the adjusted delay time. In some embodiments, when the number of occurrences of the metastable event is too low, the operational circuit 110 may utilize the adjustment signal AD2 to adjust the delay parameter of each of the delay circuits D1~DN such that the delay time caused by each of the delay circuits D1-DN is increased. When the number of occurrences of the metastable event is too much, the operational circuit 110 may utilize the adjustment signal AD2 to adjust the delay parameter of each delay circuits D1~DN such that the delay time caused by each of the delay circuits D1~DN is reduced. In this embodiment, the operational circuit 110 provides the adjustment signal AD2 to the delay circuits D1~DN, but the disclosure is not limited thereto. In other embodiments, the operational circuit 110 may provide the adjustment signal AD2 to some delay circuits. In some embodiments, the operational circuit 110 provides different adjustment signals AD2 to different delay circuits. Therefore, the delay parameter of one of the delay circuits D1~DN is different from the delay parameter of another of the delay circuits D1~DN.

In other embodiments, after receiving the sampled signals $X_1 \sim X_N$, the operational circuit 110 activates a timer (not shown). The timer performs a counting operation. When the performing time of the timer reaches a third predetermined time, the timer may send an interrupt signal (not shown). In such cases, after receiving the interrupt signal, the operational circuit 110 determines whether the count value CT is equal to a predetermined value. When the count value CT is not equal to a predetermined value, the operational circuit 110 increases the frequency of the clock signal CLK.

The present disclosure does not limit the sequence of generating the adjustment signal AD1 and AD2 provided by the operational circuit 110. In one embodiment, when the number of occurrences of the metastable event is too low, the operational circuit 110 only provides the adjustment signal AD1 and does not provide the adjustment signal AD2. In such cases, when the frequency of the clock signal CLK reaches the maximum frequency, if the number of occurrences of the metastable event is still too low, the operational circuit 110 provides an adjustment signal AD2. In another embodiment, when the number of occurrences of the metastable event is too low, the operational circuit 110 provides the adjustment signal AD2 and does not provide the adjustment signal AD1. In this case, when the delay time caused by each of the delay circuits D1~DN reaches the maximum time, if the number of occurrences of the metastable event is still too low, the operational circuit 110 starts to provide the adjustment signal AD1.

Since the point in time at which the metastable event occurs and the level of the incorrect sampled signal caused by the metastable event cannot be predicted, when the operational circuit 110 generates a random variable RN according to the sampled signals $X_1 \sim X_N$, the random variable RN cannot be predicted. Therefore, the security of the random variable RN is increased. For example, when the metastable event does not occur, the levels of the sampled signals $X_1 \sim X_N$ are correct. However, when a metastable event occurs, the level of one or more of the sampled signals $X_1 \sim X_N$ is wrong; for example, there may be a high level or a low level. Since the wrong level cannot be predicted, if the operational circuit 110 serves the sampled signal having the wrong level as the random variable RN, the predictability of the random variable RN can be reduced.

Figure 2:
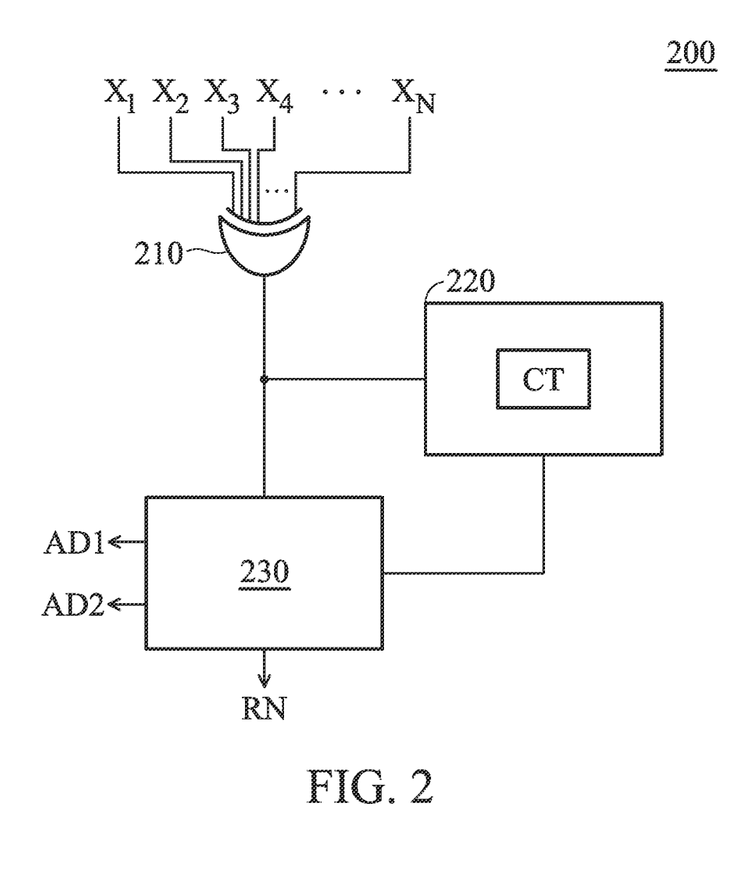
FIG. 2 is a schematic diagram of an exemplary embodiment of an operational circuit according to various aspects of the present disclosure.

FIG. 2 is a schematic diagram of an exemplary embodiment of an operational circuit according to various aspects of the present disclosure. As shown in FIG. 2, the operational circuit 200 comprises an XOR gate 210, a counter 220, and a processor 230. The XOR gate 210 receives the sampled signals $X_1$~$X_N$. When the level of one of the sampled signals $X_1$~$X_N$ is different from the level of another of the sampled signals $X_1$~$X_N$, the XOR gate 210 outputs a first level. When the levels of the sampled signals $X_1$~$X_N$ are the same for each other, the XOR gate 210 outputs a second level. The second level is the opposite of the first level. In one embodiment, the first level is a high level, and the second level is a low level.

The counter 220 is coupled to the XOR gate 210 and adjusts the count value CT according to the output from the XOR gate 210. In one embodiment, when the XOR gate 210 outputs a first level, the counter 220 adjusts (e.g., to increase or reduce) the count value CT. When the XOR gate 210 outputs a second level, the counter 220 does not adjust the count value CT. In this embodiment, the count value CT relates with the number of occurrences of the metastable event.

The processor 230 is coupled to the XOR gate 210 and the counter 220. In one embodiment, the processor 230 generates the random variable RN according to the output of the XOR gate 210. In this case, the processor 230 directly serves the output of the XOR gate 210 as the random variable RN. In another embodiment, the processor 230 receives the sampled signals $X_1$~$X_N$ and serves the sampled signal having the wrong level as the random variable RN. In other embodiments, the processor 230 is coupled to the counter 220 to read the count value CT. In this case, the processor 230 generates at least one of the adjustment signals AD1 and AD2 according to the count value CT.

Figure 3:
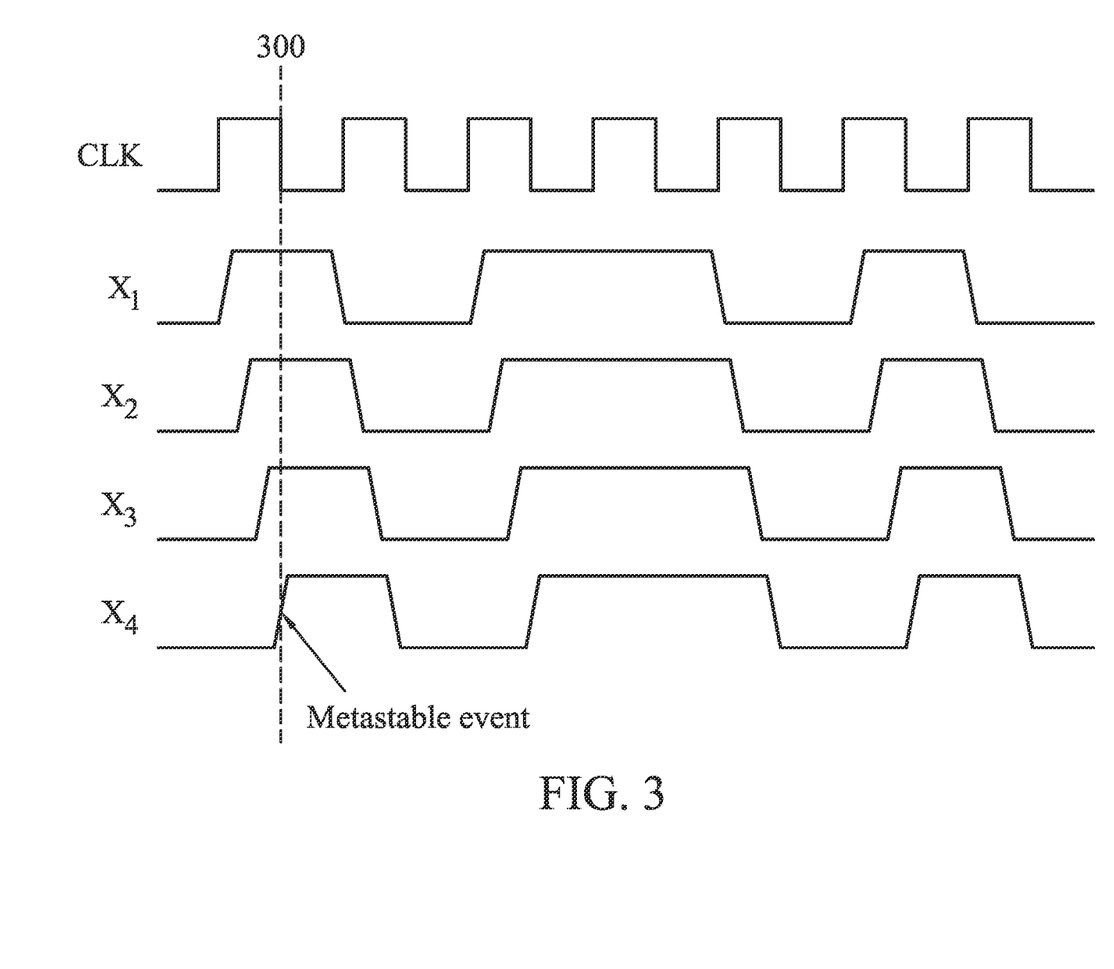
FIG. 3 is a schematic diagram of an exemplary embodiment of sampled signals according to various aspects of the present disclosure.

FIG. 3 is a schematic diagram of an exemplary embodiment of sampled signals according to various aspects of the present disclosure. To brevity, FIG. 3 only shows the sampled signals $X_1$~$X_4$. In the time point 300, the clock signal CLK triggers the sampling circuits S1~S4. Therefore, the sampling circuits S1~S4 generate the sampled signals $X_1$~$X_4$. In this case, since the set time and the hold time of the sampling circuit S4 are not appropriate at the time point 300, the level of the sampled signal $X_4$ is not stabilized and maintained at a target level at the time point 300.

Figure 4:
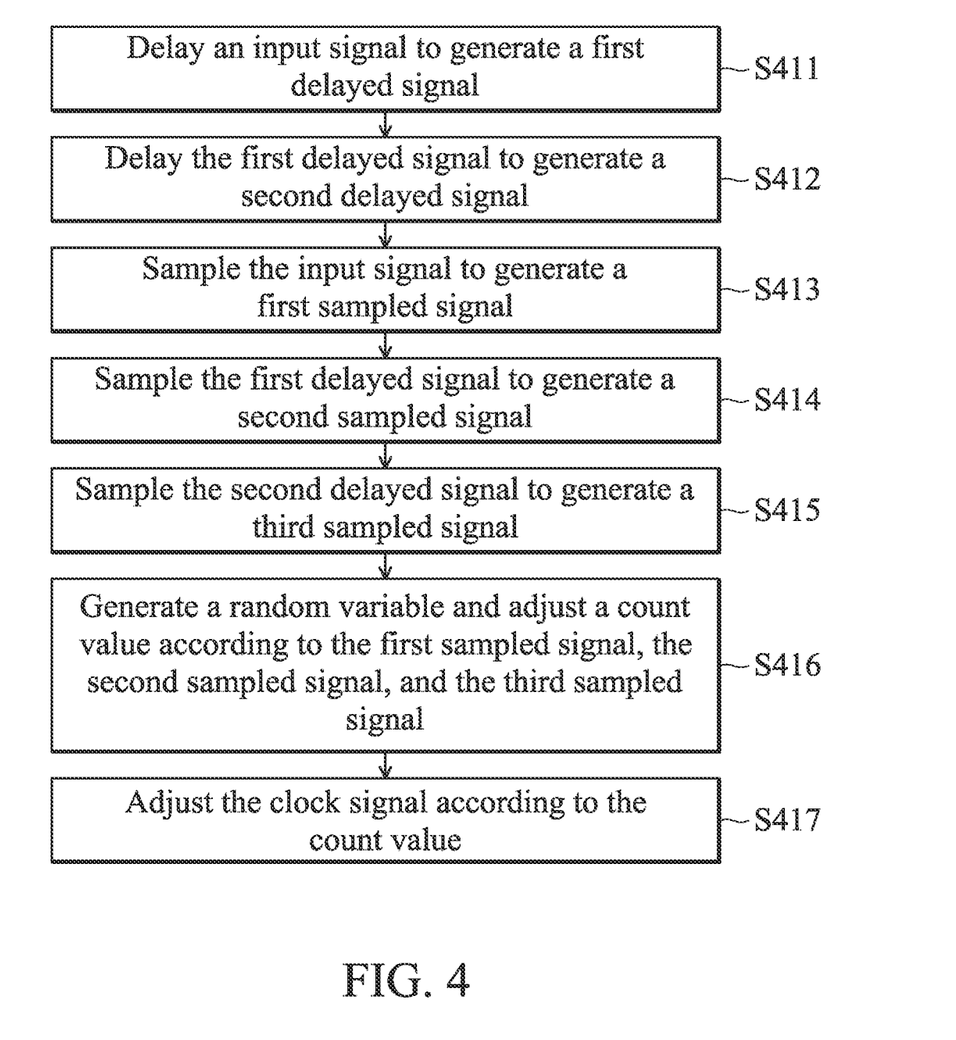
FIG. 4 is a flowchart of an exemplary embodiment of a true random-number generating method according to various aspects of the present disclosure.

FIG. 4 is a flowchart of an exemplary embodiment of a true random-number generating method according to various aspects of the present disclosure. First, an input signal is received and delayed to generate a first delayed signal (step S411). In one embodiment, step S411 uses a first delay circuit. In such cases, the first delay circuit delays the input signal according to first delay time. In some embodiments, the input signal is random data.

Next, the first delayed signal is delayed to generate a second delayed signal (step S412). In one embodiment, step S412 uses a second delay circuit. In such cases, the second delay circuit delays the first delayed signal according to second delay time. In this case, the second delay circuit is connected to the first delay circuit in series. The first delay time may be the same as or different from the second delay time.

The input signal is sampled according to a clock signal to generate a first sampled signal (step S413). In one embodiment, step S413 uses a first sampling circuit to sample the input signal. In some embodiment, the first sampling circuit may be a flip-flop, a latch or a register.

The first delayed signal is sampled according to the clock signal to generate a second sampled signal (step S414). In one embodiment, step S414 uses a second sampling circuit to sample the first delayed signal. In some embodiment, the second sampling circuit may be a flip-flop, a latch or a register.

The second delayed signal is sampled according to the clock signal to generate a third sampled signal (step S415). In one embodiment, step S415 uses a third sampling circuit to sample the second delayed signal. In some embodiments, the third sampling circuit is a flip-flop, a latch or a register.

A random variable is generated and a count value is adjusted according to the first sampled signal, the second sampled signal, and the third sampled signal (step S416). In one embodiment, step S416 may perform an XOR operation for the first sampled signal, the second sampled signal, and the third sampled signal and serves an operation result as the random variable. In another embodiment, step S416 may detect the levels of the first sampled signal, the second sampled signal and the third sampled signal. Assume that the level of the first sampled signal is different from the level of each of the second sampled signal and the third sampled signal. In this case, step S416 serves the first sampled signal as a random variable.

In other embodiments, step S416 determines whether a metastable event occurs according to the first sampled signal, the second sampled signal, and the third sampled signal. When a metastable event occurs, step S416 is to adjust a count value. However, when there is not a metastable event, step S416 does not adjust the count value. In some embodiments, when the level of the first sampled signal, the second sampled signal, or the third sampled signal is different than the level of another of the first sampled signal, the second sampled signal, or the third sampled signal, step S416 is to adjust the count value. However, when the levels of the first sampled signal, the second sampled signal, and the third sampled signal are the same, step S416 does not adjust the count value.

The clock signal is adjusted according to the count value (step S417). In one embodiment, step S417 first detects the time it takes for the count value to reach predetermined value. When the time it takes for the count value to reach the predetermined value is longer than the first predetermined time, step S417 is performed to increase the frequency of the clock signal. Additionally, when time it takes for the count value CT to reach the predetermined value is shorter than the second predetermined time, step S417 reduces the frequency of the clock signal.

In other embodiments, step S417 determines whether the count value is equal to a predetermined value after the third predetermined time. When the count value does not equal to the predetermined value, step S417 is to increase the frequency of the clock signal. In some embodiments, step S417 further adjusts the delay time between the first delayed signal and the second delayed signal. In such cases, step S417 adjusts at least one of first delay time and the second delay time.

True random-number generating methods, or certain aspects or portions thereof, may take the form of a program code (i.e., executable instructions) embodied in tangible media, such as floppy diskettes, CD-ROMs, hard drives, or any other machine-readable storage medium, wherein, when the program code is loaded into and executed by a machine such as a computer, the machine thereby becomes a true random-number generator for practicing the methods. The true random-number generating methods may also be embodied in the form of a program code transmitted over some transmission medium, such as electrical wiring or cabling, through fiber optics, or via any other form of transmission, wherein, when the program code is received and loaded into and executed by a machine such as a computer, the machine becomes a true random-number generator for practicing the disclosed methods. When implemented on a general-purpose processor, the program code combines with the processor to provide a unique apparatus that operates analogously to application-specific logic circuits.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will be understood that although the terms "first," "second," etc. may be used herein to describe various elements, these elements should not be limited by these terms. These terms are only used to distinguish one element from another.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A true random-number generator to generate a random variable and comprising:
    a first delay circuit delaying an input signal to generate a first delayed signal;
    a second delay circuit delaying the first delayed signal to generate a second delayed signal;
    a first sampling circuit sampling the input signal according to a clock signal to generate a first sampled signal;
    a second sampling circuit sampling the first delayed signal according to the clock signal to generate a second sampled signal;
    a third sampling circuit sampling the second delayed signal according to the clock signal to generate a third sampled signal; and
    an operational circuit generating the random variable and adjusting a count value according to the first sampled signal, the second sampled signal, and the third sampled signal,
    wherein the operational circuit adjusts a frequency of the clock signal according to the count value.

2. The true random-number generator as claimed in claim 1, wherein the operational circuit adjusts at least one of a delay parameter of the first delay circuit and a delay parameter of the second delay circuit according to the count value.

3. The true random-number generator as claimed in claim 1, wherein:
    the operational circuit determines whether a metastable event occurs according to the first sampled signal, the second sampled signal, and the third sampled signal, and
    in response to the metastable event occurring, the operational circuit adjusts the count value.

4. The true random-number generator as claimed in claim 1, wherein in response to a level of one of the first sampled signal, the second sampled signal and the third sampled signal being different from a level of another of the first sampled signal, the second sampled signal and the third sampled signal, the operational circuit adjusts the count value.

5. The true random-number generator as claimed in claim 4, wherein in response to the levels of the first sampled signal, the second sampled signal and the third sampled signal being the same, the operational circuit stops adjusting the count value.

6. The true random-number generator as claimed in claim 5, wherein the operational circuit comprises:
    an XOR gate receiving the first sampled signal, the second sampled signal and the third sampled signal,
    wherein:
    in response to the level of one of the first sampled signal, the second sampled signal and the third sampled signal being different than the level of another of the first sampled signal, the second sampled signal and the third sampled signal, the XOR gate outputs a first level, and
    in response to the levels of the first sampled signal, the second sampled signal and the third sampled signal being the same, the XOR gate outputs a second level which is opposite of the first level.

7. The true random-number generator as claimed in claim 6, wherein the operational circuit further comprises:
    a counter coupled to the XOR gate,
    wherein:
    in response to the XOR gate outputting the first level, the counter adjusts the count value, and
    in response to the XOR gate outputting the second level, the counter stops adjusting the count value.

8. The true random-number generator as claimed in claim 1, wherein the operational circuit determines the time it takes for the count value to reach a predetermined value, in response to the determined time being longer than a first predetermined time, the operational circuit increases the frequency of the clock signal.

9. The true random-number generator as claimed in claim 8, wherein in response to the determined time being less than a second predetermined time, the operational circuit reduces the frequency of the clock signal.

10. The true random-number generator as claimed in claim 1, wherein after a third predetermined time, the operational circuit determines whether the count value is equal to a predetermined value, and in response to the count value not being equal to the predetermined value, the operational circuit increases the frequency of the clock signal.

11. The true random-number generator as claimed in claim 1, wherein the input signal is random data.

12. A random-number generating method for generating a random variable and comprising:
    delaying an input signal to generate a first delayed signal;
    delaying the first delayed signal to generate a second delayed signal;
    sampling the input signal according to a clock signal to generate a first sampled signal;

sampling the first delayed signal according to the clock signal to generate a second sampled signal;

sampling the second delayed signal according to the clock signal to generate a third sampled signal;

generating the random variable and adjusting a count value according to the first sampled signal, the second sampled signal and the third sampled signal; and adjusting a frequency of the clock signal according to the count value.

13. The random-number generating method as claimed in claim 12, further comprising:

adjusting delay time between the first delayed signal and the second delayed signal according to the count value.

14. The random-number generating method as claimed in claim 12, further comprising:

determining whether a metastable event occurs according to the first sampled signal, the second sampled signal and the third sampled signal;

adjusting the count value in response to the metastable event occurring; and stopping the adjustment of the count value in response to the metastable event not occurring.

15. The random-number generating method as claimed in claim 12, wherein the step of adjusting the count value comprises:

detecting levels of the first sampled signal, the second sampled signal and the third sampled signal; and adjusting the count value in response to the level of one of the first sampled signal, the second sampled signal and the third sampled signal being different than the level of another of the first sampled signal, the second sampled signal and the third sampled signal.

16. The random-number generating method as claimed in claim 15, wherein the step of adjusting the count value comprises:

stopping the adjustment of the count value in response to the levels of the first sampled signal, the second sampled signal and the third sampled signal being the same.

17. The random-number generating method as claimed in claim 12, wherein the step of adjusting the clock signal comprises:

determining the time it takes for the count value to reach the predetermined value; and increasing the frequency of the clock signal in response to the time it takes for the count value to reach the predetermined value being longer than a first predetermined time.

18. The random-number generating method as claimed in claim 17, wherein the step of adjusting the clock signal further comprises:

reducing the frequency of the clock signal in response to the time it takes for the count value to reach the predetermined value being less than a second predetermined time.

19. The random-number generating method as claimed in claim 12, further comprising:

determining whether the count value is equal to a predetermined value after a third predetermined time; and increasing the frequency of the clock signal in response to the count value not being equal to the predetermined value.

20. The random-number generating method as claimed in claim 12, wherein the input signal is random data.

* * * * *